United States Patent
Kehl et al.

(10) Patent No.: US 7,433,190 B2
(45) Date of Patent: Oct. 7, 2008

(54) LIQUID COOLED ELECTRONIC CHASSIS HAVING A PLURALITY OF PHASE CHANGE MATERIAL RESERVOIRS

(75) Inventors: Kenyon Kehl, Tucson, AZ (US); Tom J. Phielix, Tucson, AZ (US); William A. Cronin, Tucson, AZ (US)

(73) Assignee: Honeywell International Inc., Morristown, NJ (US)

( * ) Notice: Subject to any disclaimer, the term of this patent is extended or adjusted under 35 U.S.C. 154(b) by 105 days.

(21) Appl. No.: 11/544,175

(22) Filed: Oct. 6, 2006

(65) Prior Publication Data

US 2008/0084666 A1    Apr. 10, 2008

(51) Int. Cl.
*H05K 7/20* (2006.01)
*H01L 23/36* (2006.01)

(52) U.S. Cl. .............. 361/700; 361/689; 361/724; 174/15.1; 165/80.4; 165/80.5; 372/34; 62/259.2

(58) Field of Classification Search ......... 361/687–689, 361/699–702, 719–727; 174/15.1, 16.1, 174/16.3, 252; 165/10, 0.3, 80.4, 80.5, 104.33, 165/104.34, 104.17, 104.21–122, 164–170, 165/902; 372/34–36; 62/259.2, 259.3, 457.2, 62/457.9

See application file for complete search history.

(56) References Cited

U.S. PATENT DOCUMENTS

| | | | |
|---|---|---|---|
| 4,975,803 A | 12/1990 | Niggemann | |
| 5,007,478 A | 4/1991 | Sengupta | |
| 5,057,968 A * | 10/1991 | Morrison | 361/700 |
| 5,455,458 A | 10/1995 | Quon et al. | |
| 6,104,611 A | 8/2000 | Glover et al. | |
| 6,169,247 B1 * | 1/2001 | Craft et al. | 174/15.1 |
| 6,239,502 B1 | 5/2001 | Grewe et al. | |
| 6,260,613 B1 | 7/2001 | Pollard, II | |
| 6,261,871 B1 | 7/2001 | Langari et al. | |
| 6,307,871 B1 * | 10/2001 | Heberle | 372/34 |
| 6,397,618 B1 * | 6/2002 | Chu et al. | 62/259.2 |
| 6,417,577 B1 | 7/2002 | Grewe et al. | |
| 6,419,389 B1 * | 7/2002 | Fuchs et al. | 378/199 |
| 6,570,895 B2 * | 5/2003 | Heberle | 372/34 |
| 6,609,561 B2 | 8/2003 | Sauciuc et al. | |
| 6,621,702 B2 * | 9/2003 | Elias et al. | 361/700 |
| 6,631,755 B1 | 10/2003 | Kung et al. | |
| 6,848,500 B1 | 2/2005 | Langari et al. | |
| 6,888,720 B2 * | 5/2005 | Pfister et al. | 361/689 |
| 6,889,755 B2 | 5/2005 | Zuo et al. | |
| 7,002,800 B2 | 2/2006 | Elias et al. | |
| 7,316,262 B1 * | 1/2008 | Rini et al. | 165/10 |
| 7,327,578 B2 * | 2/2008 | Novotny | 361/724 |

(Continued)

*Primary Examiner*—Michael V Datskovskiy
(74) *Attorney, Agent, or Firm*—Ingrassia, Fisher & Lorenz, P.C.

(57) ABSTRACT

A system and method of thermal management of electrical and electronic systems and components that adequately maintains the temperatures of the system electronics and electrical devices within reliable limits during various postulated system malfunctions. The system and method use a phase change material (PCM). In at least some embodiments, the PCM is disposed such that, if a flow of coolant ceases when primary and backup control circuits are energized, primary control circuit temperature will exceed a predetermined temperature within a first time period after the flow of coolant ceases, and backup control circuit temperature will exceed the predetermined temperature a second time period, which is greater than the first time period, after the flow of coolant ceases.

13 Claims, 1 Drawing Sheet

U.S. PATENT DOCUMENTS

| | | |
|---|---|---|
| 2003/0007328 A1 | 1/2003 | Fischer |
| 2003/0202306 A1 | 10/2003 | Dubhashi |
| 2005/0007740 A1 | 1/2005 | Neuschuetz et al. |
| 2005/0051300 A1 | 3/2005 | Searls et al. |

* cited by examiner

LIQUID COOLED ELECTRONIC CHASSIS HAVING A PLURALITY OF PHASE CHANGE MATERIAL RESERVOIRS

TECHNICAL FIELD

The present invention relates to cooling of electrical and electronic devices and, more particularly, to a cooling system and method for electrical devices that includes a phase change material.

BACKGROUND

Many electrical and electronic systems, such as the electrical and electronic control systems mounted on turbine engines, may be subjected to potentially harsh environmental conditions, such as relatively high temperatures. These systems also include a plurality of electrical devices that, when energized, generate heat. Thus, in order to ensure a relatively high level of reliability during normal operating conditions, these system are typically designed with specific consideration given to thermal management. For example, in many instances thermal management is implemented via a fluid cooling system, which supplies a flow of fluid through a heat sink, such as a cold plate, that is thermally coupled to at least some of the electrical devices. The fluid removes the heat transferred to the cold plate from both the electrical devices and the surrounding environment, thereby maintaining the temperature of the electrical devices at a sufficiently low temperature.

Although the thermal management systems, such as the one described above, are generally safe, reliable, and robust, these systems do suffer potential drawbacks. For example, various scenarios have been postulated in which the thermal management system may not provide sufficient cooling. In particular, it is postulated that certain short duration increases in the surrounding temperature could exceed the capacity of certain thermal management systems. Moreover, malfunctions of the thermal management system that result in a partial or complete loss of cooling capability are also postulated.

Hence, there is a need for a system and method of thermal management of electrical and electronic systems and components that will adequately maintain the temperatures of the system electronics and electrical devices within reliable limits during transient temperature spikes and/or postulated thermal management system malfunctions. The present invention addresses at least this need.

BRIEF SUMMARY

The present invention provides a system and method of thermal management of electrical and electronic systems and components that will adequately maintain the temperatures of the system electronics and electrical devices within reliable limits during transient temperature spikes and/or postulated thermal management system malfunctions.

In one embodiment, and by way of example only, an electronic chassis cooling system includes a chassis, a plurality of reservoirs, a phase change material, a coolant flow passage, and a coolant supply system. The chassis has a plurality of electrical devices mounted therein that are thermally coupled to the chassis, and that are operable, when energized, to generate heat. The plurality of reservoirs is formed in the chassis, and the phase change material (PCM) is disposed within each of the reservoirs. The PCM changes phase from a first phase to a second phase at a phase-change temperature. The coolant flow passage is formed in the chassis and is coupled to receive a flow of coolant. The coolant supply system is operable to supply the flow of coolant into and through the coolant flow passage at a flow rate that, at least when the electrical devices are energized, is sufficient to both remove at least a portion of the generated heat, and maintain the PCM below the phase-change temperature.

In another exemplary embodiment, an electronic chassis cooling system includes a chassis, a plurality of reservoirs, a phase change material, a coolant flow passage, and a coolant supply system. The chassis has at least a primary control circuit and a backup control circuit mounted therein that are thermally coupled to the chassis. The primary and backup control circuits are each operable, when energized, to generate heat. The plurality of reservoirs is formed in the chassis, and the phase change material (PCM) is disposed within each of the reservoirs. The PCM changes phase from a first phase to a second phase at a phase-change temperature. The coolant flow passage is formed in the chassis and is coupled to receive a flow of coolant. The coolant supply system is operable to supply the flow of coolant into and through the coolant flow passage at a flow rate that, at least when the electrical devices are energized, is sufficient to both remove at least a portion of the generated heat, and maintain the PCM below the phase-change temperature. The reservoirs, and the PCM disposed therein, are formed in the chassis such that, if the flow of coolant ceases when the primary and backup control circuits are energized, primary control circuit temperature will exceed a predetermined temperature within a first time period after the flow of coolant ceases, backup control circuit temperature will exceed the predetermined temperature a second time period, which is greater than the first time period, after the flow of coolant ceases.

In yet another exemplary embodiment, a method of controlling temperatures of at least a first circuit and a second circuit that are each configured to generate heat when energized includes the steps of thermally coupling the first and second circuits to a heat sink having a coolant flowing therethrough, forming one or more reservoirs in the heat sink, and disposing a phase change material (PCM) in the one or more reservoirs. The reservoirs are formed in the heat sink such that, if the flow of coolant ceases when the first and second circuits are energized, the PCM will maintain the second circuit below a predetermined temperature for a time period longer than the first circuit.

Other independent features and advantages of the preferred system and method will become apparent from the following detailed description, taken in conjunction with the accompanying drawing which illustrates, by way of example, the principles of the invention.

DETAILED DESCRIPTION OF A PREFERRED EMBODIMENT

Figure 1:
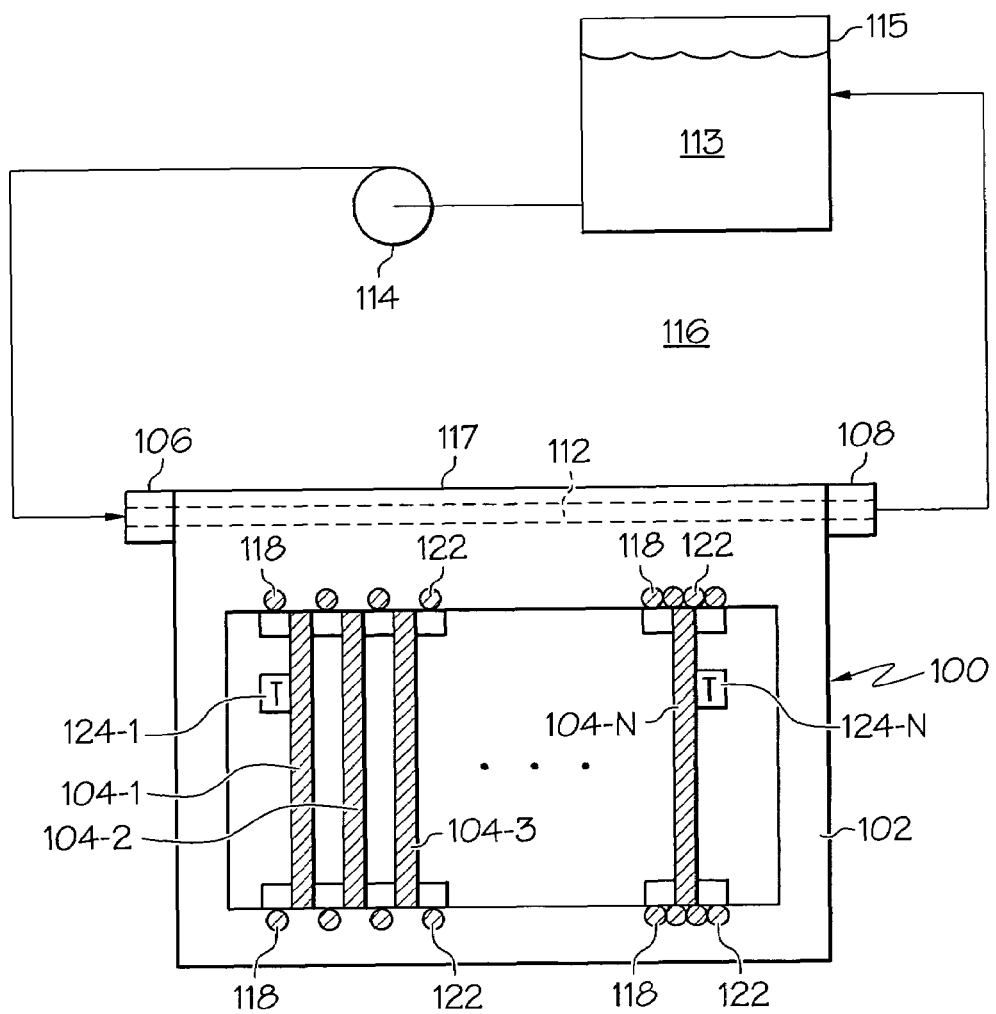
FIG. 1 is a functional schematic diagram of an electronic chassis cooling system according to an exemplary embodiment of the present invention.

The following detailed description of the invention is merely exemplary in nature and is not intended to limit the invention or the application and uses of the invention. Furthermore, there is no intention to be bound by any theory presented in the preceding background of the invention or the following detailed description of the invention.

Turning now to the description and with reference first to FIG. 1, a simplified cross section view of an exemplary electronic equipment enclosure 100 is depicted. The enclosure 100 includes a chassis 102, in which are mounted a plurality of electrical devices 104. In the depicted embodiment, a coolant fluid, such as water, flows through the chassis 102. In this regard, and as FIG. 1 further depicts, the chassis 102 includes a fluid inlet 106, a fluid outlet 108, and one or more coolant flow passages 112 (only one illustrated) extending between the fluid inlet 106 and fluid outlet 108. A pump 114 or other equivalent device is used to impart flow energy to a coolant 113 stored in a coolant reservoir 115, causing the coolant to flow into and through the chassis 102. As the coolant flows through the chassis 102, it absorbs the heat from the surrounding environment 116, as well as the heat generated by the electrical devices 104 when the devices 104 are energized. It will be appreciated that in some embodiments, such as the one depicted in FIG. 1, the chassis 102 may comprise one or more cold plates 117.

The electrical devices 104, at least in the depicted embodiment, are implemented as a plurality of electronic circuit boards 104 (e.g., 104-1, 104-2, 104-3, ... 104-N) that are thermally coupled to the cold plate 117. It will be appreciated that the electrical devices are not limited to those configured as electronic circuit boards 104, but could be configured, for example, as individual electronic components, electronic circuit packages, or one or more groups of individual components. Furthermore, it will be appreciated that the electrical devices 104 may be mounted in, and thermally coupled to, the chassis 102 using any one of numerous mounting and thermal coupling configurations. Moreover, although the configuration and implementation of the electrical devices 104 may vary, in a particular preferred embodiment, one of the electronic circuit boards 104 is configured as a primary control circuit 104-1, and another is configured as a backup control circuit 104-N. The primary control circuit 104-1, when properly energized and connected, is the primary control source for one or more non-illustrated external devices. The backup control circuit 104-N, when properly energized and connected, is the backup control source for the one or more non-illustrated external devices, in the event the primary control circuit 104-1 becomes inoperable.

In one particular embodiment, which is depicted in FIG. 1, the primary and backup control circuits 104-1, 104-N are each configured to automatically electrically shutdown if the circuit temperatures exceed a predetermined temperature. To assist in implementing this function, the primary and backup control circuits 104-1, 104-N include a primary control circuit temperature sensor 124-1 and a backup control circuit temperature sensor 124-N, respectively. The primary and backup control circuit temperature sensors 124-1, 124-N sense the temperature of at least a portion of the primary and backup control circuits 104-1, 104-N, respectively, and supply primary and backup control circuit temperature signals representative thereof. The primary control circuit 104-1 is responsive to the primary control circuit temperature signal to automatically electrically shutdown if the primary control circuit temperature signal indicates that primary control circuit temperature exceeds the predetermined temperature. Similarly, the backup control circuit 104-N is responsive to the backup control circuit temperature signal to automatically electrically shutdown if the backup control circuit temperature signal indicates that backup control circuit temperature exceeds the predetermined temperature.

As FIG. 1 additionally depicts, a plurality of reservoirs 118 are formed in the chassis 102, and a phase change material (PCM) 122 is disposed within each reservoir 118. A PCM 122, as is generally known, is a material that absorbs significantly more heat during its change of phase, due to the latent heat of vaporization or fusion, than in its stable states. During the change of phase from one state to another (e.g., from a solid state to a liquid state, or vice-versa), a PCM 122 absorbs heat with little or no increase in the temperature of the material itself, and may therefore be used to passively cool and regulate the temperature of the electrical devices 104. It will be appreciated that the relative degree of cooling that the PCM 122 provides is dependent upon the amount of PCM 122 used, the type of PCM 122 used, and the placement of the PCM 122 within the chassis 102.

As is also generally known, different types of PCM 122 change phase at different predetermined phase change temperatures. Hence, the temperature at which the passive cooling provided by a PCM 122 takes place can be selected by choosing the appropriate PCM 122. Various types of PCM 122 may be disposed within the reservoirs 118 and may include, for example, various paraffin waxes, and various salt hydrides. It will be appreciated that the particular PCM 122 that is selected may include not only a PCM 122 that transitions from a liquid phase to a solid phase and back to a liquid phase, such as a paraffin wax, but also a PCM 122, such as neopentyl glycol, which transitions from a first solid phase to a second solid phase.

With the above background in mind, it is noted that the reservoirs 118 are configured and located in the chassis 102, the PCM 122 is selected, and the coolant flow rate through the coolant flow passage 112 is provided, such that the coolant maintains the PCM 122 below the phase change temperature. It will be appreciated that the coolant flow rate through the flow passage 112 is additionally sufficient to maintain the primary and backup control circuits 104-1, 104-N below the above-mentioned predetermined temperature, as well as to sufficiently cool the remaining electrical devices 104-2, 104-3, ... 104-(N-1) mounted in the chassis 102. If, however, coolant flow rate through the flow passage 112 stops, or is otherwise reduced to a rate that cannot provide sufficient cooling for the electrical devices 104, or the heat load exceed the capacity of the cooling system, the PCM 122 will absorb the heat generated by the electrical devices 104 and from the surrounding environment, to sufficiently cool the electrical devices 104 for at least a period of time sufficient to implement a controlled shutdown.

In a particular preferred embodiment, the reservoirs 118 are located, and the PCM 122 is selected, such that, if the flow of coolant ceases (or is otherwise inadequate) when at least the primary and backup control circuits 104-1, 104-N are energized, the backup control circuit 104-N will be maintained below its predetermined shutdown temperature for a longer period of time than the primary control circuit 104-1. In particular, if the flow of coolant ceases, the reservoirs 118 and PCM 122 are disposed such that the primary control circuit temperature will exceed the predetermined shutdown temperature within a first time period after the flow of coolant ceases, and the backup control circuit temperature will exceed the predetermined shutdown temperature a second time period, which is greater than the first time period, after the flow of coolant ceases. In this manner, the backup control circuit 104-N will remain energized and operable for a period of time longer than the primary control circuit 104-1. It will be appreciated that the particular lengths of the first and second time periods may vary from system to system. It is seen that in the depicted embodiment this is accomplished by disposing additional reservoirs 118 and PCM 122 adjacent the backup control circuit 104-N. It will be appreciated, however, that this is merely exemplary of one methodology for implementing this function.

While the invention has been described with reference to a preferred embodiment, it will be understood by those skilled in the art that various changes may be made and equivalents may be substituted for elements thereof without departing from the scope of the invention. In addition, many modifications may be made to adapt to a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

We claim:

1. An electronic chassis cooling system, comprising:
   a chassis having a plurality of electrical devices mounted therein that are thermally coupled to the chassis, the electrical devices operable, when energized, to generate heat;
   a plurality of heat sink devices coupled between the electrical devices and the chassis, to thereby thermally couple the electrical devices to the chassis;
   a plurality of reservoirs formed in the chassis;
   a phase change material (PCM), disposed within each of the reservoirs, that changes phase from a first phase to a second phase at a phase-change temperature;
   a coolant flow passage formed in the chassis and coupled to receive a flow of coolant; and
   a coolant supply system operable to supply the flow of coolant into and through the coolant flow passage at a flow rate that, at least when the electrical devices are energized, is sufficient to:
   (i) remove at least a portion of the generated heat, and
   (ii) maintain the PCM below the phase-change temperature.

2. The system of claim 1, wherein the coolant supply system comprises:
   a coolant reservoir having a volume of coolant disposed therein; and
   a coolant pump having an inlet and an outlet in fluid communication with the coolant reservoir and operable to supply to the flow of coolant to the coolant flow passage.

3. The system of claim 1, wherein the chassis comprises a cold plate having the plurality of reservoirs and the coolant flow passage formed therein.

4. The system of claim 3, wherein the cold plate is disposed to transfer heat from a surrounding environment to the coolant.

5. The system of claim 1, wherein:
   the plurality of electrical devices comprise at least a primary control circuit and a backup control circuit; and
   the reservoirs, and the PCM disposed therein, are formed in the chassis such that, if the flow of coolant ceases when at least the primary and backup control circuits are energized,:
      primary control circuit temperature will exceed a predetermined temperature within a first time period after the flow of coolant ceases,
      backup control circuit temperature will exceed the predetermined temperature a second time period after the flow of coolant ceases, and
      the second time period is greater than the first time period.

6. The system of claim 5, wherein:
   the primary control circuit comprises a primary control circuit temperature sensor configured to sense a temperature of at least a portion of the primary control circuit and supply a primary control circuit temperature signal representative thereof;
   the primary control circuit is configured, in response to the primary control circuit temperature signal, to automatically electrically shutdown when the primary control circuit temperature signal indicates that the temperature of at least a portion of the primary control circuit exceeds the predetermined temperature;
   the backup control circuit comprises a backup control circuit temperature sensor configured to sense a temperature of at least a portion of the backup control circuit and supply a backup control circuit temperature signal representative thereof; and
   the backup control circuit is configured, in response to the backup control circuit temperature signal, to automatically electrically shutdown when the backup control circuit temperature signal indicates that the temperature of at least a portion of the backup control circuit exceeds the predetermined temperature.

7. The system of claim 5, wherein:
   the primary control circuit and backup control circuit are each configured to automatically electrically shutdown when each exceeds the predetermined temperature.

8. An electronic chassis cooling system, comprising:
   a chassis having at least a primary control circuit and a backup control circuit mounted therein that are thermally coupled to the chassis, the primary and backup control circuits each operable, when energized, to generate heat;
   a plurality of reservoirs formed in the chassis;
   a phase change material (PCM), disposed within each of the reservoirs, that changes phase from a first phase to a second phase at a phase-change temperature;
   a coolant flow passage formed in the chassis and coupled to receive a flow of coolant; and
   a coolant supply system operable to supply the flow of coolant into and through the coolant flow passage at a flow rate that, at least when the electrical devices are nominally energized, is sufficient to (i) remove at least a portion of the generated heat, and (ii) maintain the PCM below the phase-change temperature,
   wherein the reservoirs, and the PCM disposed therein, are formed in the chassis such that, if the flow of coolant ceases when the primary and backup control circuits are energized:
      primary control circuit temperature will exceed a predetermined temperature within a first time period after the flow of coolant ceases,
      backup control circuit temperature will exceed the predetermined temperature a second time period after the flow of coolant ceases, and
      the second time period is greater than the first time period.

9. The system of claim 8, wherein the coolant supply system comprises:
   a coolant reservoir having a volume of coolant disposed therein; and
   a coolant pump having an inlet and an outlet in fluid communication with the coolant reservoir and operable to supply to the flow of coolant to the coolant flow passage.

10. The system of claim 8, further comprising:
    a plurality of heat sink devices coupled between the electrical devices and the chassis, to thereby thermally couple the electrical devices to the chassis.

11. The system of claim 8, wherein the chassis comprises a cold plate having the plurality of reservoirs and the coolant flow passage formed therein.

12. The system of claim 11, wherein the cold plate is disposed to transfer heat from a surrounding environment to the coolant.

13. The system of claim 8, wherein:
the primary control circuit comprises a primary control circuit temperature sensor configured to sense a temperature of at least a portion of the primary control circuit and supply a primary control circuit temperature signal representative thereof;
the primary control circuit is configured, in response to the primary control circuit temperature signal, to automatically electrically shutdown when the primary control circuit temperature signal indicates that the temperature of at least a portion of the primary control circuit exceeds the predetermined temperature;
the backup control circuit comprises a backup control circuit temperature sensor configured to sense a temperature of at least a portion of the backup control circuit and supply a backup control circuit temperature signal representative thereof; and
the backup control circuit is configured, in response to the backup control circuit temperature signal, to automatically electrically shutdown when the backup control circuit temperature signal indicates that the temperature of at least a portion of the backup control circuit exceeds the predetermined temperature.

* * * * *